United States Patent
Lin et al.

(10) Patent No.: US 6,784,755 B2
(45) Date of Patent: Aug. 31, 2004

(54) COMPACT, HIGH POWER SUPPLY REJECTION RATIO, LOW POWER SEMICONDUCTOR DIGITALLY CONTROLLED OSCILLATOR ARCHITECTURE

(75) Inventors: Heng-Chih Lin, Plano, TX (US); Baher S. Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/292,276

(22) Filed: Nov. 12, 2002

(65) Prior Publication Data

US 2003/0184390 A1 Oct. 2, 2003

Related U.S. Application Data

(60) Provisional application No. 60/368,240, filed on Mar. 28, 2002.

(51) Int. Cl.[7] .................................................. H03B 1/00
(52) U.S. Cl. ............................................ 331/57; 331/17
(58) Field of Search ........................... 331/57, 17, 1 A; 327/12

(56) References Cited

U.S. PATENT DOCUMENTS

| | | | | |
|---|---|---|---|---|
| 5,382,922 A | * | 1/1995 | Gersbach et al. ........... 331/1 A |
| 6,181,168 B1 | * | 1/2001 | Zarubinsky et al. .......... 327/12 |
| 6,208,211 B1 | * | 3/2001 | Zipper et al. ................. 331/17 |
| 6,294,962 B1 | * | 9/2001 | Mar ............................. 331/57 |
| 6,633,202 B2 | * | 10/2003 | Yang et al. .................... 331/57 |

* cited by examiner

Primary Examiner—Robert Pascal
Assistant Examiner—Joseph Chang
(74) Attorney, Agent, or Firm—Frederick J. Telecky, Jr.; W. James Brady, III

(57) ABSTRACT

A high PSRR, low power semiconductor digitally controlled oscillator (DCO) architecture employs only one simple current steering D/A converter directly on top of a multi-stage current controlled oscillator. The architecture provides a good building block for many circuit applications, e.g., all digital phase lock loops, direct modulation transmitters for wireless devices, and the like.

10 Claims, 2 Drawing Sheets

COMPACT, HIGH POWER SUPPLY REJECTION RATIO, LOW POWER SEMICONDUCTOR DIGITALLY CONTROLLED OSCILLATOR ARCHITECTURE

CLAIM TO PRIORITY OF PROVISION APPLICATION

This application claims priority under 35 U.S.C. § 119(e)(1) of provisional application Ser. No. 60/368,240, filed Mar. 28, 2002, by Heng-Chih Lin, Baher S. Haroun and Tim Foo.

BACKGROUND OF THE INVENTION

1. Field of the Invention

This invention relates generally to digitally controlled oscillators and more particularly to a compact, high power supply rejection ratio (PSRR), low power semiconductor digitally controlled oscillator (DCO) architecture.

2. Description of the Prior Art

Deep sub-micron CMOS technology demands that most analog circuits be implemented in the digital domain; while high supply noise associated with digital circuitry demands a high Power Supply Rejection Ratio (PSRR) for the circuit. Digitally controlled oscillators are popular building blocks in phase lock loop (PLL) circuits that employ deep sub-micron CMOS technology where more and more analog circuits are implemented in the digital domain. A simple, robust, high power supply rejection (PSR) DCO is a must for system integration due to high supply noise associated with digital circuitry.

A digital controlled oscillator (DCO) can be implemented in many ways. Typically, a digital-to-analog converter (DAC) is used to convert a digital code into an appropriate voltage or current which directly controls the oscillation frequency. Other implementations digitally control the effective R, C and/or L of the associated ring oscillators.

FIGS. 1–4 shows 4 popular DCO architectures. The DCO 100 depicted in FIG. 1 changes the oscillation frequency by digitally controlling the resistance 102. The DCO 200 depicted in FIG. 2 changes the oscillation frequency by digitally controlling the capacitance 202. The DCO 300 depicted in FIG. 3 changes the oscillation frequency by changing the control voltage through DAC 302, then applying this voltage to a typical voltage controlled oscillator (VCO) 304. The DCO 400 depicted in FIG. 4 changes the oscillation frequency by changing the control current through DAC 402, then mirroring the current to a current controlled oscillator (ICO) 404.

The DCO architectures 100, 200 shown in FIGS. 1 and 2 are problematic in that for a given required frequency step resolution, the same switches and R/C structures need to be implemented on every oscillator stage. This not only increases the area, but also introduces unnecessary noise on the oscillator due to the switch activities near by. The DCO architecture 300 shown in FIG. 3 is problematic in that voltage is more sensitive to noise; and the oscillator still needs some "buffer" on top to have good PSRR. The DCO architecture 400 shown in FIG. 4 is problematic in that more power is wasted in the DAC 402 and current mirror 406, and the possible mismatch in the mirroring current.

It is therefore advantageous and desirable in view of the foregoing, to provide a high PSRR, low power semiconductor digitally controlled oscillator (DCO) architecture that employs only one simple current steering D/A converter directly on top of multi-stage current controlled oscillators.

SUMMARY OF THE INVENTION

The present invention is directed to a high PSRR, low power semiconductor digitally controlled oscillator (DCO) architecture that employs only one simple current steering D/A converter directly on top of a multi-stage current controlled oscillator. The architecture provides a good building block for many circuit applications, e.g., all digital phase lock loops, direct modulation transmitters for wireless devices, and the like.

According to one embodiment, a digitally controlled oscillator (DCO) comprises a current controlled oscillator; a current source configured to provide a bias current for the current controlled oscillator; and no more than one current steering digital-to-analog converter (DAC) directly on top of the current controlled oscillator; wherein the DAC is configured to selectively steer a tuning current provided by the DAC into the current controlled oscillator to control the frequency of oscillation provided by the current controlled oscillator.

According to another embodiment, a digitally controlled oscillator (DCO) comprises a multi-stage current controlled oscillator; a current source directly on top of the current controlled oscillator and configured to provide a bias current for the current controlled oscillator; and at least one current steering digital-to-analog converter (DAC) directly on top of the current controlled oscillator and configured to generate and steer a tuning current into the current controlled oscillator to control its frequency of oscillation.

According to yet another embodiment, a method of controlling an oscillation frequency comprises the steps of providing a high PSRR, low power semiconductor digitally controlled oscillator (DCO) that employs only one simple current steering D/A converter directly on top of a multi-stage current controlled oscillator; and generating and steering a current into the multi-stage current controlled oscillator via the D/A converter to control the frequency of oscillation.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings wherein.

While the above-identified drawing figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

As stated herein before, a digital controlled oscillator (DCO) can be implemented in many ways. Typically, a digital-to-analog converter (DAC) is used to convert a digital code into an appropriate voltage or current which directly controls the oscillation frequency. Other implementations digitally control the effective R, C and/or L of the associated ring oscillators.

FIGS. 1–4 shows 4 popular DCO architectures. The DCO 100 depicted in FIG. 1 changes the oscillation frequency by digitally controlling the resistance 102. The DCO 200 depicted in FIG. 2 changes the oscillation frequency by digitally controlling the capacitance 202. The DCO 300 depicted in FIG. 3 changes the oscillation frequency by changing the control voltage through DAC 302, then applying this voltage to a typical voltage controlled oscillator (VCO) 304. The DCO 400 depicted in FIG. 4 changes the oscillation frequency by changing the control current through DAC 402, then mirroring the current to a current controlled oscillator (ICO) 404.

Figure 1:
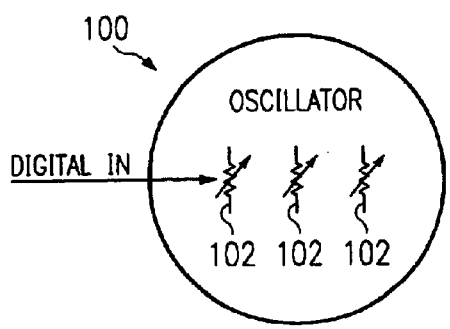
FIG. 1 illustrates a known DCO architecture that changes the oscillation frequency by digitally controlling the resistance.
Figure 2:
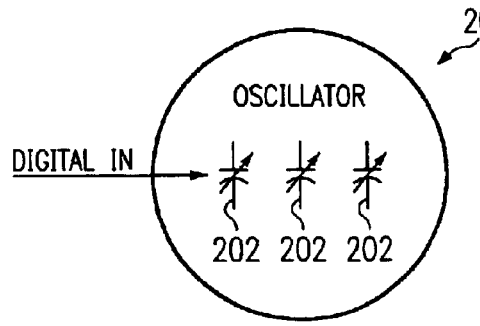
FIG. 2 illustrates a known DCO architecture that changes the oscillation frequency by digitally controlling the capacitance.
Figure 3:
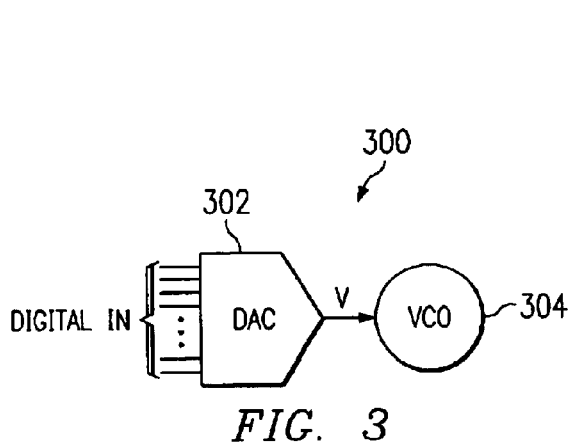
FIG. 3 illustrates a known DCO architecture that changes the oscillation frequency by changing the control voltage through a DAC, and then applying this voltage to a typical voltage controlled oscillator (VCO)
Figure 4:
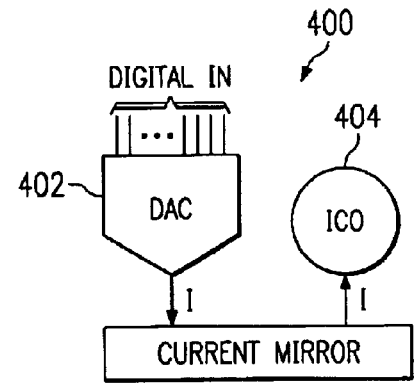
FIG. 4 illustrates a known DCO architecture that changes the oscillation frequency by changing the control current through a DAC, and then mirroring the current to a current controlled oscillator (ICO)

The DCO architectures 100, 200 shown in FIGS. 1 and 2 are problematic in that for a given required frequency step resolution, the same switches and R/C structures need to be implemented on every oscillator stage. This not only increases the area, but also introduces unnecessary noise on the oscillator due to the switch activities near by. The DCO architecture 300 shown in FIG. 3 is problematic in that voltage is more sensitive to noise; and the oscillator still needs some "buffer" on top to have good PSRR. The DCO architecture 400 shown in FIG. 4 is problematic in that more power is wasted in the DAC 402 and current mirror 406, and the possible mismatch in the mirroring current.

Figure 5:
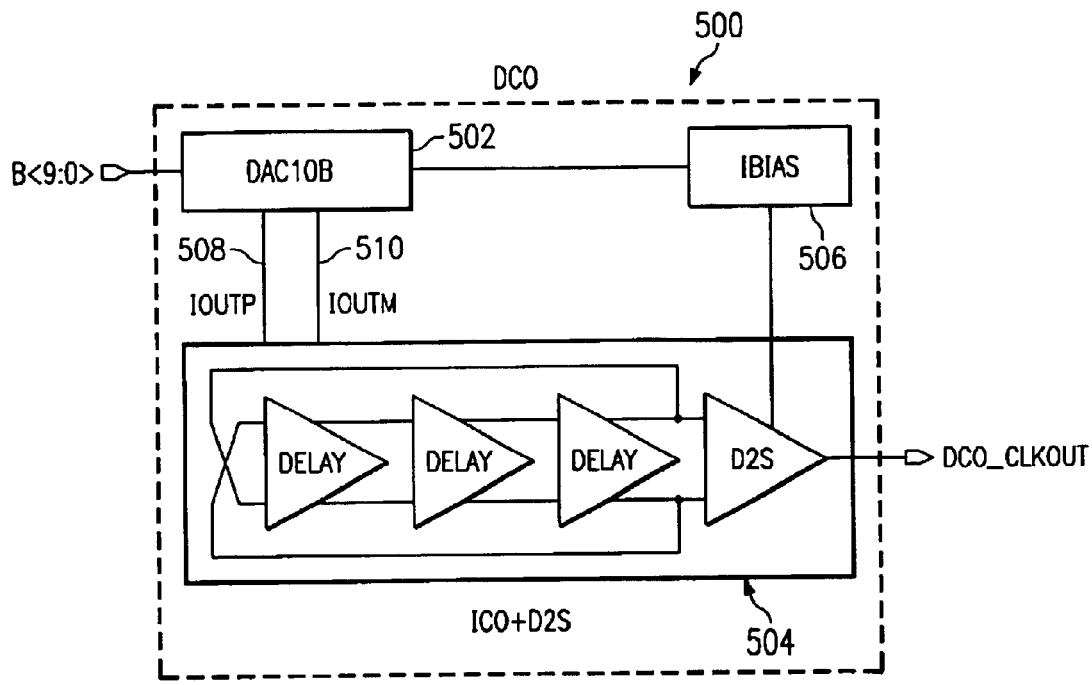
FIG. 5 illustrates a DCO architecture according to one embodiment of the present invention.

FIG. 5 illustrates a DCO architecture 500 according to one embodiment of the present invention. DCO 500 employs a compact, high PSRR, low power architecture which uses only one simple current steering D/A converter 502 directly on top of a multi-stage current controlled oscillator 504. As seen in FIG. 5, a current steering DAC 502 is put directly on top of multi-stage ICO 504. The present inventors found the use of only one DAC 502 to provide for simpler design, smaller silicon area, and better matching characteristics. The current source 506 on top was found by the present inventors to further provide good PSRR. The use of a current controlled oscillator 504 (instead of voltage controlled) was found to allow digital switches to be placed far away from the sensitive oscillator 504, thus providing for less jitter. Current steering 508, 510 into capacitors was found by the present inventors to also provide good frequency averaging effects.

Figure 6:
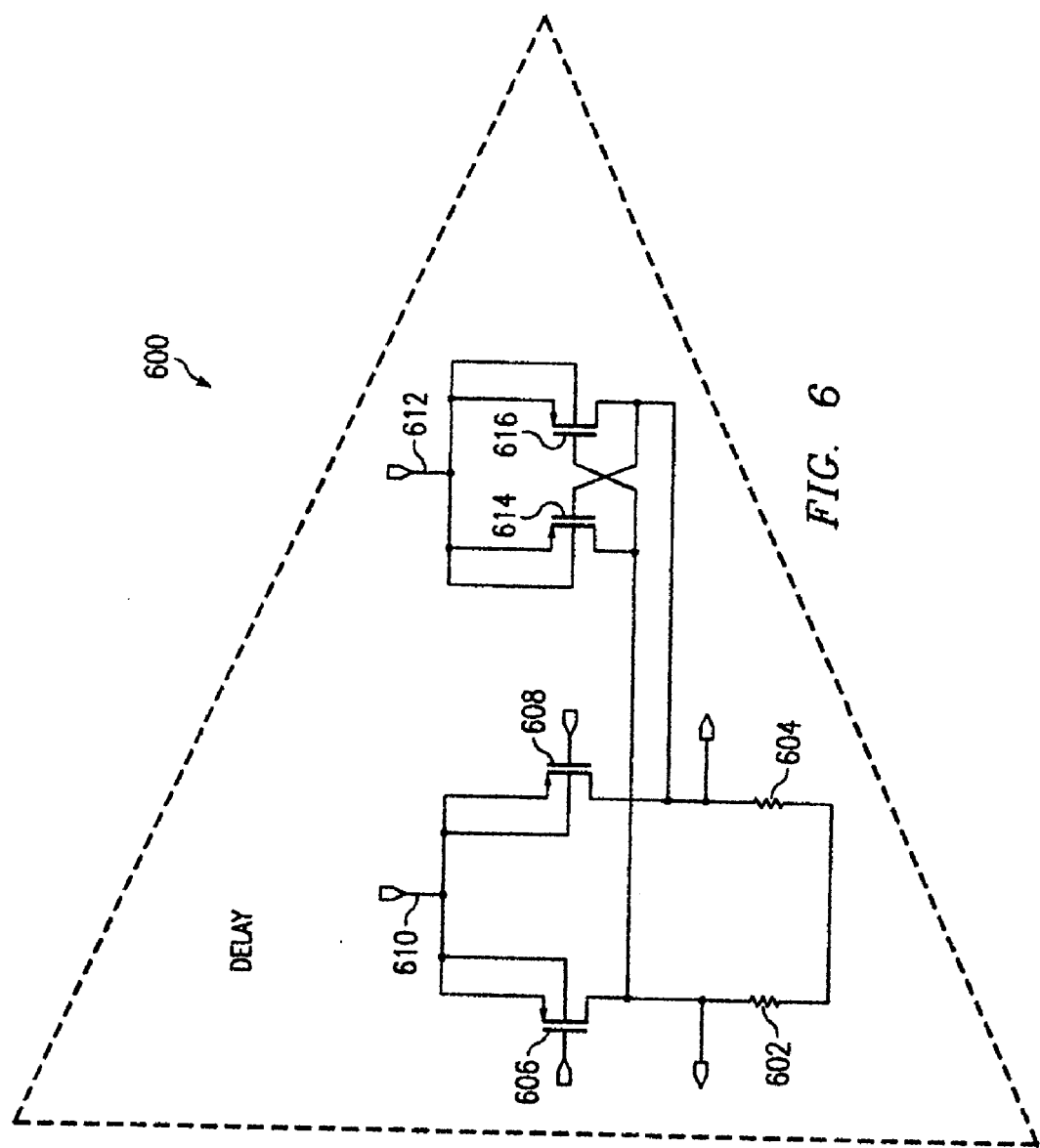
FIG. 6 is a more detailed schematic diagram of the delay element depicted in FIG. 5.

FIG. 6 illustrates one embodiment of an ICO 504 delay stage 600. The effective resistance is the parallel combination of one semiconductor resistor 602, 604 and a selected current tuned negative PMOS resistance 606, 608, 614, 616. The steering of current level 508, 510 on the crossing coupling PMOS pair (606, 608), (614, 616) changes the respective negative resistance 606, 608 values, and thus, the associated oscillation frequency. The present inventors found that a minimum amount of offset current (10–20% of the total current) was required to be provided on both legs 610, 612 during the DAC 502 current steering in order to guarantee oscillation. Those skilled in the current biasing art will readily appreciate this offset current can be easily implemented by adding some additional fixed current elements inside DAC 502 using any well known technique.

In summary explanation, a high PSRR, low power semiconductor digitally controlled oscillator (DCO) architecture 500 is provided that employs only one simple current steering D/A converter 502 directly on top of a multi-stage current controlled oscillator 504. The architecture provides a good building block for many circuit applications, e.g., all digital phase lock loops, direct modulation transmitters for wireless devices, and the like.

In view of the above, it can be seen the present invention presents a significant advancement in the digitally controlled oscillator art. Further, this invention has been described in considerable detail in order to provide those skilled in the DCO art with the information needed to apply the novel principles and to construct and use such specialized components as are required.

Further, in view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A digitally controlled oscillator (DCO) comprising:

a current controlled oscillator;

a current source configured to provide a bias current for the current controlled oscillator; and no more than one current steering digital-to-analog converter (DAC) directly on top of the current controlled oscillator, wherein the DAC is configured to selectively steer a tuning current provided by the DAC into the current controlled oscillator to control the frequency of oscillation provided by the current controlled oscillator, wherein the current controlled oscillator comprises a multi-stage digitally controlled oscillator (DCO) and the multi-stage DCO comprises at least one delay stage including a current controlled negative MOS resistance operational to tune the frequency of oscillation in response to the tuning current.

2. The DCO according to claim 1 wherein the current source is directly on top of the current controlled oscillator to achieve a desired power supply rejection (PSR) level.

3. The DCO according to claim 1 wherein the DAC is further configured to provide an offset current on each current steering leg during the DAC current steering in order to guarantee oscillation.

4. The DCO according to claim 3 wherein the offset current is about 10% to about 20% of the total steering current.

5. A digitally controlled oscillator (DCO) comprising:

a multi-stage current controlled oscillator;

a current source directly on top of the current controlled oscillator and configured to provide a bias current for the current controlled oscillator; and at least one current steering digital-to-analog converter (DAC) directly on top of the current controlled oscillator and configured to generate and steer a tuning current into the current controlled oscillator to control its frequency of oscillation, wherein at least one stage of the multi-stage current controlled oscillator comprises a delay element and the delay element comprises a current controlled negative MOS resistance operational to tune the frequency of oscillation in response to the tuning current.

6. The DCO according to claim 5 wherein the DAC is further configured to provide an offset current on each current steering leg during the DAC current steering in order to guarantee oscillation.

7. The DCO according to claim 6 wherein the offset current is about 10% to about 20% of the total steering current.

8. The DCO according to claim 5 wherein the current source is positioned to provide a desired power supply rejection (PSR) level.

9. A method of controlling an oscillation frequency, the method comprising the steps of:

providing a high PSRR, low power semiconductor digitally controlled oscillator (DCO) that employs only one simple current steering D/A converter directly on top of a multi-stage current controlled oscillator; and generating and steering a current into the multi-stage current controlled oscillator via the D/A converter to control the frequency of oscillation, wherein the step of generating and steering a current into the multi-stage current controlled oscillator via the D/A converter to control the frequency of oscillation comprises passing the steering current through a current controlled negative MOS resistance operational to tune the frequency of oscillation in response to the tuning current.

10. The method according to claim 9 further comprising the step of generating an offset current via the D/A converter on each current steering leg during the DAC current steering in order to guarantee oscillation.

* * * * *